United States Patent
Constant

[11] 4,053,750
[45] Oct. 11, 1977

[54] FEEDFORWARD FILTER

[76] Inventor: James N. Constant, 1603 Danbury Drive, Claremont, Calif. 91711

[21] Appl. No.: 684,861

[22] Filed: May 10, 1976

[51] Int. Cl.² ............................................. G06F 7/38
[52] U.S. Cl. .................................................. 364/724
[58] Field of Search ...................... 235/152, 156, 181; 328/167

[56] References Cited

U.S. PATENT DOCUMENTS

| | | | |
|---|---|---|---|
| 3,619,586 | 11/1971 | Hoff, Jr. et al. ..................... | 235/156 |
| 3,703,632 | 11/1972 | Shanks ................................. | 235/152 |
| 3,979,684 | 9/1976 | Acker .................................. | 328/167 |

OTHER PUBLICATIONS

Bede Liv, "Effect of Finite Word Length on the Accuracy of Digital Filters" *IEEE Trans. on Ckt. Theory*, vol. CT-18, No. 6, Nov. 1971, pp. 620-677.

*Primary Examiner*—David H. Malzahn
*Attorney, Agent, or Firm*—Harris, Kern, Wallen & Tinsley

[57] ABSTRACT

In a general filter (with zeros and poles) having input and output signals $x$ and $y$ and having impulse response $g$, apparatus and method for obtaining the convolution $y = g * x$. By implementing the filter as a feedforward filter, the error normally associated with the filter is minimized.

15 Claims, 4 Drawing Figures

FEEDFORWARD FILTER

BACKGROUND OF THE INVENTION

The present invention relates to signal processing using matched filters, correlators, convolvers, fourier analyzers, inverse Fourier analyzers, and more particularly to low-noise signal processors (filters) having feedforward correction of two signals $x$ and $y$ in real time. The signals $x$ and $y$, for example, may be the transmitted and received signals in a radar, sonar, communications system, or the input and output of a general filter.

A number of useful ways of designing filters are known in the prior filter art including direct convolution, fast convolution, and recursive filtering. In direct convolution the filter is realized by computing the convolution integral, in fast convolution by using the fast Fourier transofrm (FFT) or chirp-z transform (CZT) to compute the Fourier transform Y of signal $y$ and then inverse transforming to obtain $y$, and in recursive filtering by using linear difference equations. A given filter design can be obtained in a general purpose computer or using special purpose hardware. Analog and digital filters are discussed in a number of publications including the article by Squire et al "Linear Signal Processing and Ultrasonic Transversal Filters" appearing in the November 1969 issue of IEEE Transactions on Microwave Theory and Techniques, in the book by Gold and Rader "Digital Processing of Signals" McGraw-Hill 1969, in the book edited by Rabiner and Rader "Digital Signal Processing" IEEE Press 1972, in the book by Rabiner and Gold "Theory and Application of Digital Signal Processing" McGraw-Hill 1975, and in the special issue on "Digital Signal Processing" Proceedings IEEE April, 1975. Analog filters are also implemented as servomechanisms, for example as discussed in the book edited by Merril "Principles of Guided Missile Design" Van Nostrand 1955.

Filters in the form of matched filters, correlators, and convolvers for performing the computations of matched filtering, cross and autocorrelation, and convolution are well known in the prior art. These make their computations in the time domain and are discussed in a number of publications including the paper by Whitehouse et al "High Speed Serial Access Linear Transform Implementations" Naval Undersea Center, San Diego CA 92132, January, 1973. In general apparatus fall into two broad categories; those employing acoustic means and non-acoustic means. Included in the former category are sonic, magnetostrictive, acoustic surface wave (SAW), and opto-acoustic filters while the latter category comprises charge coupled devices (CCD), binary shift registers (BSR), and random access memories (RAM). Acoustic filters have been described in the paper by Squire et al and in the paper by Holland and Claiborne "Practical Acoustic Wave Devices" appearing in the May 1974 issue of Proceedings IEEE while non-acoustic filters have been described in the paper by Byram et al "Signal Processing Device Technology" appearing in the Proceedings of the NATO Advanced Study Institute on Signal Processing held at the University of Loughborough, U.K. on 21 August through 1 Sept. 1972, and in the papers by Kosonocky and Buss et al appearing in Technical Session 2 "Introduction to Charge Coupled Devices" 1974 Wescon, Los Angeles, Sept. 10 through 13, 1974. In particular, digital implementations for matched filters, correlators, and convolvers have been disclosed in my U.S. Pat. No. 3,950,635 and in my copending applications Ser. No. 522,718 now Pat. No. 4,006,351 filed Nov. 11, 1974 and Ser. No. 595,240 filed Nov. 7, 1975.

Filters in the form of Fourier analyzers for performing the computations of the Fourier transform and inverse Fourier transform are also well known in the prior art, for example as described in the references to Squire et al, Gold and Rader, Rabiner and Rader, Rabiner and Gold, and in the special issue IEEE. These make their computations in the frequency domain and frequently use the fast Fourier transform (FFT).

From the foregoing it is clear that the prior filter art provides apparatus in a variety of forms and for a variety of applications. In particular, the digital filter with its ability to clock and manipulate waveforms — which otherwise occur and are gone in the analog filter — is now well established and is finding increased use in a wide number of applicaitons gradually displacing its analog equivalent. However, despite the many advantages offered by digital filters, there is an inherent limitation to the accuracy of these filters due to the fact that all digital networks operate with a finite number of bits. This fact is currently preventing the further development of the digital filter to its fullest potential and this problem has been discussed at length in a number of publications including the references by Gold and Rader, Rabiner and Rader, Rabiner and Gold, and in the special issue IEEE. Of course, the accuracy problem also exists with the analog filter which while not limited by the finite quantization of bits is however limited by component tolerances. To combat errors, both types of filter seek to improve the overall filter accuracy by improving the accuracy of the individual internal elements of the filter. The digital filter also seeks to combat errors by comprising the filter of cascades and parallelings of first and second order filters. Also, the well known technique of feedback has been used to improve the accuracy of filters and in fact has found wide use in control and servomechanism applications. However, there is a well known tradeoff between the net filter transfer function and accuracy which limits feedback generally to lower frequencies. Thus, while feedback has the potential for reducing filter errors it is inherently limited in many applications. Recently, the well known technique of feedforward has been used in the amplifier art to improve the accuracy of amplifiers. However, there has been no corresponding application of this technique to improve the accuracy of filters. Thus while feedforward has the potential for reducing filter errors it is not available to the prior filter art being restricted only to the prior amplifier art.

Feedback compares the input and output of a device (amplifier, filter) although these may not be simultaneous or identical quantities. Thus, a device comprised of a number of physical elements functions as a closed loop control system when some fraction or function of the output of the system is utilized to automatically adjust the input to produce the proper net output, i.e., some function F of the output Y is compared with the input X to determine the error $\epsilon = X \pm FY$ which becomes equal to zero when a proper F is chosen. The overall closed loop in practice consists generally of a number of component or secondary loops in series-parallel combinations, the number of loops and the number of elements in each being determined by the degree of control that is required. Closed loop control is distinguished from open loop control where there is no feedback and has the significant advantage that a strong artificial damping can be generated in a system that has a low natural damping factor. This can all be seen in a number of publications including the reference to Locke.

Because of the analogy between a servo circuit and an electric feedback network, the latter is used often to simulate the behavior of the servo. Basically, the mechanical and electrical elements of servos are analogous in their functions and the methods of mathematical analysis are identical. Apart from its simulation of a mechanical servo, the electric feedback network has found a plurality of uses entirely on its own merit, for example in the stabilization of amplifiers. In whichever form it may be encountered, feedback works for small transit times in comparison to the information rate being passed in the filter. This is because amplifier bandwidths of perhaps ten times or more that of the information band are required. If such device capabilities are not available, feedback diminishes as an effective control means and becomes totally inapplicable in such devices as microwave traveling wave tubes (TWTs) which actually depend on transit time for amplification. Thus while feedback has the potential it fails at the higher microwave frequencies where circuit dimensions approach the wavelengths involved. This is not the whole story since feedback also fails when the device being controlled is itelf non-linear and has long delays, i.e., in other than an amplifier, for example in a complex filter. The terms "amplifier" and "filter" as used herein are distinguished by the fact that the former relates the output to its input (except for a constant factor) while the latter relates the output to the convolution of its input by the filter impulse response.

Feedforward, in contrast, does not require that a sample of the output return to the input for comparison. Instead, all comparisons are made in a forward sequence. The avoidance of non-simultaneous comparison means that device speed need only be required for the actual information bandwidth which permits that the device parameters be used for passing the information band and not for implementing controls. Moreover, the transit time barrier does not exist in feedforward systems. This can all be seen in a number of publications including the paper by Jurgen "Feedforward Correction: A Late Blooming Design" appearing in the April 1972 issue of IEEE Spectrum and in the paper by Lubell et al "Linearizing Amplifiers for Multi-Signal Use" appearing in the April 1974 issue of Microwaves.

From the foregoing it is clear that feedback and feedforward are well known and have found use in a variety of applications involving mechanical and electrical devices. However, while feedback has been applied to both amplifiers and filters, the use of feedforward has been restricted to amplifiers in which it has been demonstrated that the feedforward correction yields excellent amplifier stabilization —to a degree and frequency not available in conventional feedback. Thus, while feedforward correction has been successfully applied to amplifiers, there is no known application of this important technique to the control of non-linear devices other than amplifiers, for example general filters.

The benefits which are to be derived from the reduction of errors in a filter are threefold; first, it becomes possible to unambiguously determine the delay of signals even though the signals may have complex shapes, modulations, components, codings, close arrival times of components, component overlappings, second, it becomes possible to accurately determine the performance of a system (filter) under test and, third, it becomes possible to determine the effect of noise and clutter. To achieve these three important situations, the prior art proceeds in a certain sequence of steps; first, it obtains the transfer function $G(z)$ of the filter in one of three canonical forms (direct, cascade, parallel) then, second, obtains the filter architecture. Unfortunately, however, the procedure is limited by filter errors, especially the input quantization and tranfer function quantization errors, which impose severe restrictions upon the physical implementation of the filter and which for the particular case of a filter with a large number of poles results in a highly inefficient and uneconomic apparatus in the prior art. As will become apparent during the course of the disclosure, the present invention overcomes these serious deficiencies in the prior filter art by implementing the filter in a feedforward circuit.

What is important in the decision to implement a filter is the accuracy and ambiguity which can be tolerated in the desired result. As example, many applications can be satisfied with a simple filter having a transfer function $G(z)$ with no poles and only zeros and from which the relationship between input and output signals $X(z)$, $Y(z)$ may be obtained as the convolution $Y(z) = G(z)X(z)$ within some low but tolerable accuracy and ambiguity. If higher accuracy and less ambiguity are desired in the application then a more complex filter having a transfer function $G(z)$ with poles and zeros must implemented to obtain the better result. In practical terms the desire for higher accuracy and less ambiguity of the desired result requires the increasingly complex specification of the filter transfer function $G(z)$, for example as a matched filter or as a matched clutter filter as discussed in my copending patent application Ser. No. 522,718. Thus the accuracy and ambiguity resolution which is required in a given applicaton will determine the degree and type of filter transfer function $G(z)$ and consequently will determine the complexity of the filter which is to be used. Now, the filter error will increase with the complexity of the filter, i.e., as higher accuracy and less ambiguity are required of the desired result. Thus, the prior art obtains higher accuracy and less ambiguity at the expense of increasing the error in a filter and is successfull only up to a certain point. Again, the present invention overcomes these serious deficiencies in the prior filter art by implementing the filter in a feedforward circuit.

From the foregoing it is clear that while the prior filter art provides apparatus and method for implementing filters it is limited by inherent filter errors. The situation is particulrly frustrating in high quality signal processing applications where the signals themselves are complex and burdened with heavy noise, clutter and inerference. By making most computations in error sensitive apparatus, the prior art is restricted to low computational speeds and apparatus having large weight, size, power consumption and cost which limit its full potential. To conserve investments in applications for which speed, weight, size, power and cost can be traded the prior art achieves savings by making computations off-line, i.e., not in real time (storing signals and using conventional computers).

From this discussion it is clear that in the past the implementation of a filter has been accomplished primarily using error sensitive devices and for all practical purposes, especially in high quality applications, has not been made commercially available to any great extent being confined to the laboratory and to certain industrial and governmental applications where performance is required at any cost.

It is the purpose of the present invention to apply the feedforward technique to the general filter problem and thereby to obtain error free filters to an accuracy not available in the prior art.

SUMMARY OF THE INVENTION

This invention provides apparatus and method for the implementation of a general filter and more particularly for the implementation of a filter in a feedward circuit.

The general purpose of the invention is to provide new and improved general filters. The term "general" is used to indicate an analog or digital filter, for example filters which have been described in the foregoing references, i.e., conventional or prior art filters. While the prior amplifier art anticipates the implementation of amplifiers in feedback and feedforward circuits and while the prior filter art anticipates the implementation of filters in feedback circuits, the system of the present invention postulates a general filter in a feedforward circuit. Utilizing the system of the present invention the accuracy of a general filter may be improved significantly over the prior art and thereby for providing new and improved general filters.

Briefly, the present invention provides an error free efficient and economic general filter for use in real time. The system is based on the use of a conventional filter in a feedforward circuit. The design is conventional up to a point, the important and distinguishing feature of the invention being its use of the feedforward technique for correcting filter errors. While the design of a conventional filter seeks to reduce errors by reducing errors of individual elements of the filter and by cascading and paralleling low order filters, the present invention offers the additional choice of reducing errors via the feedforward technique and in this manner significantly reducing the software and/or hardware which is required to implement the filter.

In view of the foregoing description, the speed of operation, simplicity of construction, minimal power and cost and accuracy of a general filter will become apparent. As a result, new and improved general filters in accordance with the present invention may be produced which are fast, simple, efficient, accurate and economically suited for use and mass consumption in a wide variety of applications, for example in the accurate determination of the frequency response and time delay of a system under test, in the unambiguous determination of closely spaced overlapping signals in a radar, sonar, communications system and, in the determination of the causality between two signals. Accordingly, the present invention may result in the significant speed of operation and accuracy and decrease in the weight, size, power consumption and costs of radars, sonars, communications systems, and test and measurement equipment.

These and other objects and advantages, the nature of the present invention, and its various features, will appear more fully upon consideration of the various illustrative embodiments now to be described in detail in connection with the accompanying drawings.

DESCRIPTION OF THE PREFERRED EMBODIMENTS

Figure 1:
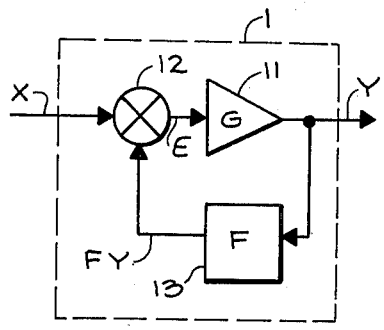
FIG. 1 is a block diagram of a feedback amplifier in the prior amplifier art, included by way of explanation.

FIG. 1 is a block diagram of a feedback amplifier 1 in the prior amplifier art. Signal $X = F\{x\}$ is inputted to direct amplifier 11 having gain G through mixer 12. The output signal $Y = F\{y\}$ is fed back to the input via feedback circuit 13 having gain F. The symbol $F\{\ \}$ denotes the Fourier transform of the quantity appearing within the brackets. Output signal Y contains the undesired amplifier 11 error. In the present disclosure it will be assumed that the input signal X is perfect, i.e., signal X has no error and the error is due to the imperfection of feedback amplifier 1. The signals X and FY are combined, for example in a mixer, multiplier, adder or differencer 12, and produce the error $\epsilon = X - FY$ at the input to amplifier 11. The net gain $H = Y/X$ is given by $$H = G/(1 + FG) \tag{1}$$

and has the net error $\Delta H = \Delta Y/X$ given by $$\Delta H = \frac{\Delta G - G^2 \Delta F}{(1 + FG)^2} \tag{2}$$

due to the individual errors $\Delta G$, $\Delta F$ of amplifier 11 and feedback circuit 13.

Referring to equations (1) and (2), the net error of feedback amplifier 1 can be reduced by increasing the product FG. This technique, however, also reduces the net gain H. As a consequence, the only improvement which is possible is by reducing the individual errors $\Delta G$, $\Delta F$. One way of doing this is specifying amplifier 11 as a feedforward amplifier, for example as suggested in my copending application Ser. No. 246,299 filed 21 April, 1972 now U.S. Pat. No. 3,971,993. It is evident that the feedback is capable of greatly stabilizing amplifier 11, i.e., a considerable change in G can be tolerated but at the expense of reducing the net gain H. Positive feedback or regeneration occurs when the sign of F is positive (+), part of the amplifier 11 output is tapped off to add to signal X. The net gain for positive feedback is given by $$H = G/(1 - FG) \tag{3}$$

and if FG approaches unity H will approach infinity and the positive feedback system becomes unstable. Consequently, positive feedback is inherently unstable and negative feedback, whereby F is negative (−) and control is excersized by making the feedback oppose the direction of signal X. Thus, negative feedback becomes more effective as FG becomes much greater than unity and becomes practically useless as a control mechanism as FG approaches unity. The conclusion is that negative feedback is useful only when FG >> 1 but this reduces the available net gain H, as is well known and appreciated.

Figure 2:
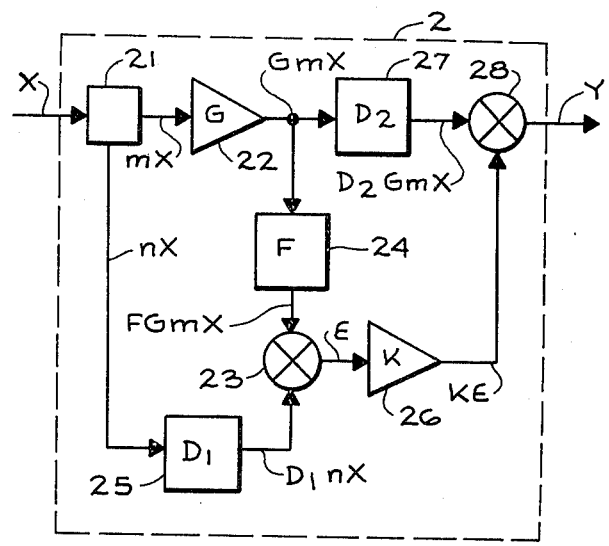
FIG. 2 is a block diagram of a feedforward amplifier in the prior amplifier art, included by way of explanation.

FIG. 2 is a block diagram of a feedforward amplifier 2 in the prior amplifier art. Signal X is inputted to a signal divider 21 which divides the signal X in two parts $mX$ and $nX$ where $m$, $n$ are related by $m + n = 1$. Signal $mX$ is inputted to main amplifier 22 with gain G whose output GmX goes to a first mixer, multiplier, adder or differencer 23 through attenuator 24. The output signal GmX of amplifier 22 contains the undesired amplifier error and is inputted to attenuator 24 having gain F whose output FGmX is then combined with signal $D_1nX$, from a first delay means 25 which receives input the signal $nX$ from signal divider 21, in mixer 23 to produce the error $\epsilon = D_1nX - FGmX$ at the input to error amplifier 26 with gain K. The output signal GMX of amplifier 22 is also inputted to a second delay means 27. Delay means 25, 27 have gains $D_1$, $D_2$ respectively adjust the delay of signals in their respective paths and are key to the succesfull implementation of feedforward amplifier 2. Finally signal $D_2GmX$ from second delay means 27 and signal K $\epsilon$ from error amplifier 26 are combined in second mixer, multiplier, adder or differencer 28 to obtain the output signal Y. The net gain $H = Y/X$ is given by (when $D_1 = D_2$ and $K = G$)

$$H = [m \mp n \pm FGm]G \quad (4)$$

and has the net error $\Delta H = \Delta Y/X$ given by $$\Delta H = [m \mp n \pm 2FGm]\Delta G \pm G^2 m \Delta F \quad (5)$$

due to the individual errors $\Delta G$, $\Delta F$ of amplifiers 22, 26 and attenuator 24. In order to simplify the discussion, it has been assumed that delay means 25, 27 are perfect, i.e., have no error. It is a simple task to include the errors from these sources in equation (5). The plus-minus signs in equations (4) and (5) refer to the choice of the second mixer 28 as an adder or differencer.

Referring to equations (4) and (5), the net error $\Delta H$ of feedforward amplifier 2 can be reduced by choosing the signal X fractions m, n and by choosing the product FG. For example, choosing the bracket term in equation (4) equal to unity and choosing FG = 1 results in the net gain $H = G$ and net error $\Delta H = 0$. It is evident that the feedforward technique is capable of stabilizing amplifier 22, i.e., a considerable change in G can be tolerated and, unlike feedback, with no corresponding effect upon the net gain H. The conclusion is that the feedforward technique is an improved control mechanism over feedback, as is all well known and appreciated. Feedforward amplifiers have been discussed in a number of publications including the foregoing references of Jurgen, Lubell et al, and in U.S. Pat. Nos. 3,471,798, 3,541,467, and 3,649,927 to Seidel. In particular, it will be appreciated that the prior amplifier art system of FIG. 2 computes the function $y = Gx$, i.e., a linear relationship between the input signal x and output signal y of feedforward filter 2.

Figure 3:
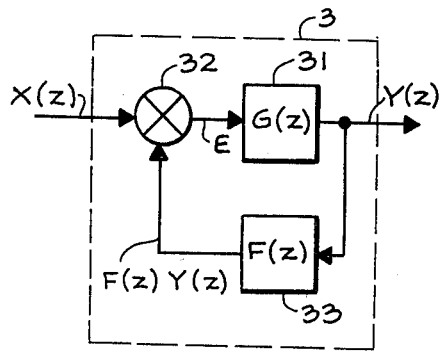
FIG. 3 is a block diagram of a feedback filter in the prior filter art, included by way of explanation.

FIG. 3 is a block diagram of a feedback filter in the prior filter 3 art. Signal X(z) is inputted to direct filter 31 having transfer function G(z) through mixer 32. The input signal Y(z) is fed back to the input via feedback filter 33 having transfer function F(z). Output signal Y(z) contains the undesired filter 31 error. The signals X(z) and F(z)Y(2) are combined, for example in a mixer, multiplier, adder or differencer 32 and these produce the error $\epsilon = X(z) - F(z)Yz$ at the input to filter 31. The net transfer function H(z) and net error $\Delta H(z)$ are given by equations (1) and (2), respectively, except for the fact that the real numbers G, F in these equations must now be replaced by the complex numbers G(z), F(z) where z is the complex variable. Thus, in the prior filter art system of FIG. 3, the net gain H(z) and net error $\Delta H(z)$ are no longer real numbers but are now complex numbers. Insofar as the gain portions of H(z) and $\Delta H(z)$ are concerned, the previous comments made in connection with the system of FIG. 1 apply; the difference between the two systems of FIGS. 1 and 3 being the effect of phase and frequency as well as amplitude on the stable operation of a system.

Figure 4:
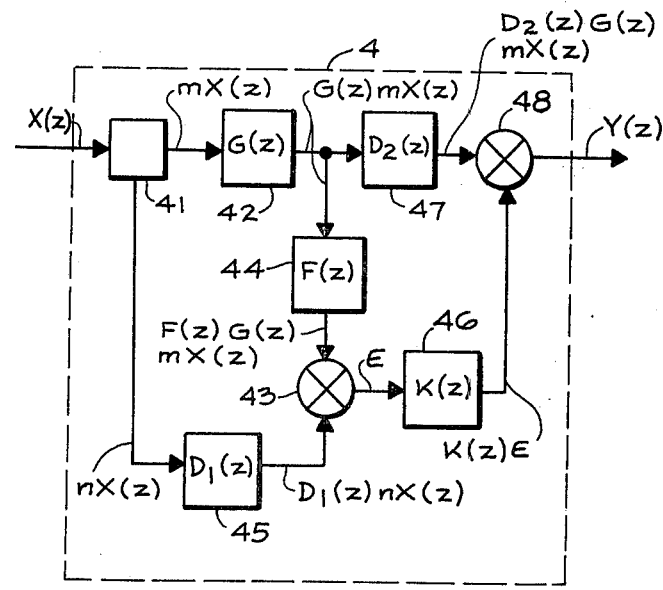
FIG. 4 is a block diagram of a feedforward filter of the system of the present invention.

FIG. 4 is a block diagram of a feedforward filter 4 in accordance with the system of the present invention. Signal X(z) is inputted to signal divider 41 which divides signal X(z) in two parts mX(zin two parts mX(x) and nX(z) where $m + n = 1$. Signal mX(z) is inputted to main filter 42 having transfer function G(z) whose output G(z)mX(z) goes to a first mixer, multiplier, adder or differencer 43 through second filter 44 having transfer function F(z). Signal nX(z) also goes to mixer 43 through first delay filter 45 having transfer function $D_1(z)$. The output signal G(z)mX(z) of filter 42 contains the undesired filter error and is inputted to filter 44 whose output F(z)G(z)mX(z) is then combined with the output signal $D_1(z)nX(z)$ from first delay means 45 in mixer 22 to produce the error $\epsilon = F(z)G(z)mX(z) - D_1(z)nX(z)$ at the input to error filter 46 having transfer function K(z). Signal G(z)mX(z) from filter 42 goes to a second mixer 48 through second delay means 47 having transfer function $D_2(z)$. Delay filters 45, 47 adjust the shape and delay of signals in their respective paths and are key to the successfull implementation of feedforward filter 4. Finally, signal $D_2(z)G(z)mX(z)$ from second delay means 47 and signal K(z) $\epsilon$ from error filter 46 are combined in a second mixer, multiplier, adder or differencer 48 to obtain the output signal Y(z). The net transfer function H(z) and net error $\Delta H(z)$ are given by equations (4) and (5), respectively (assuming $D_1(z) = D_2(z)$ and $K(z) = G(z)$ by way of example), except for the fact that the real numbers G, F in these equations must now be replaced by the complex numbers G(z), F(z) where z is the complex variable. Thus, in the system of the invention of FIG. 4, the net gain H(z) and net error $\Delta H(z)$ are no longer real numbers but are now complex numbers. Insofar as the gain portions of H(z), $\Delta H(z)$ are concerned, the previous comments made in connection with the system of FIG. 2 apply; the difference between the two systems of FIGS. 2 and 4 being the effect of phase and frequency as well as amplitude on the stable operation of the system. In particular, it will be appreciated that the present invention system of FIG. 4 computes the function $y = g * x$, i.e., the convolution between the input signal $x = F^{-1}\{x\}$ and the impulse response $g = F^{-1}\{G\}$ where the symbols $F^{-1}\{\ \}$ and * denote the inverse Fourier transform of the quantity appearing in the brackets and convolution, respectively.

From the foregoing, it will be appreciated that equations (1), (2) with complex numbers G(z), F(z) represent the prior art feedback filter 3 while equations (4), (5) with complex numbers G(z), F(z) represent the feedforward filter 4 of the present invention. While either filter 3 or 4 can be utilized to stabilize a given filter 31 Or 42, the system of the invention, i.e., filter 4 accomplishes this task to a net transfer function H(z) and net error $\Delta H(z)$ not available in the prior art feedback filter 3. Briefly, this can be seen through the examination of equations (1), (2) and (4), (5) with complex numbers G(z), F(z). For example, it is a well known fact in the prior filter art that the transfer function of a digital filter is commonly described in terms of its z-domain transfer function $$G(z) = \frac{\sum_{i=0}^{n} a_i z^{-i}}{1 + \sum_{i=1}^{n} b_i z^i} \quad (6)$$

where $z^{-1}$ is the unit delay operator. This can be seen in a number of publications including the reference by Rabiner and Gold. Clearly, if equation (6) for the filter transfer function G(z) and a corresponding function for F(z) are used in equations (1), (2) and (4), (5) the results provide for the net transfer function H(z) and net error ΔH(z) of a feedback filter 3 or feedforward filter 4 having more zeros and poles to those already in G(z) but with the latter filter providing for the easy removal of zeros and poles in the net function H(z) and ΔH(z). This means that the net transfer and error characteristics are more complex for the feedback filter 3 and feedforward filter 4 than for the filter 31 or 42 whose error it is we desire to remove but that the feedforward filter 4 of the invention offers the important advantage of removing errors without affecting the basic transfer function G(z) of a filter. The conclusion is that the feedforward filter 4 of the system of the present invention is stable in applications for which the feedback filter 3 of the prior art fails. By implementing a filter in a feedforward circuit, therefore, the system of the present invention extends the apparatus and method of a general filter to applications not covered by the prior art which when confronted with the inability to further reduce filter errors by improving the individual errors of filter elements has left open only the option of feedback.

Referring to FIG. 4, it will be appreciated that signal divider 41, filter 42, mixer 43, filter 44, delay filter 45, error filter 46, delay filter 47 and mixer 48 may be any one of a number of known units of analog or digital means for performing the indicated operations. For example, signal divider 41 may be a power or voltage divider, analog or digital multiplier or divider, mixer 43 may be a power or voltage divider or coupler, analog or digital multiplier, adder or differencer, or in combination with filter 44 may be a fourport coupler as suggested by Seidel, delay means 45, 47 may be analog or digital delay lines of the non-dispersive or dispersive types, and mixer 48 may be an error injection network or coupler, analog or digital multiplier, adder or differencer. In particular, the system of the invention specifies filters 42, 44, 46 in the form of analog or digital filters. for example filters suggested in the references by Squire et al, Gold and Rabiner, Rabiner and Rader, Rabiner and Gold, special issue IEEE, Whitehouse et al, Holland and Clayborne, Byram et al, Kosonocky and Buss, my U.S. Pat. No. 3,950,635 and my copending applications Ser. Nos. 522,718 and 595,240. In some applications, filter 42 may act as an expander of signal mx while filter 44 may act as a compressor of the signal $m \, g * x$. In this application filters 42, 44 which may be utilized are well known in the radar and commmunications arts. For example, FIG. 9.6 in the book by Skolnik "Introduction to Radar Systems" McGraw-Hill 1962 shown an expander in the form of a multitap dispersive delay line which can be utilized to implement filter 42, and also shows a matched filter compressor in the form of multitap dispersive delay line which can be utilized to implement filter 44. Filters 42, 44 may also assume the form of encoder-decoder devices, for example as shown in FIGS. F-6 and F-10 in the article by Carr "Elastic Surface Waves — Many New Applications" appearing in the November 1972 issue of Astronautics and Aeronautics. In general, filters 42, 44, 45, 46, 47 may assume any one of a number of known forms including longitudinal, recirculating, or transversal filters using acoustic, non-acoustic, analog or digital, optoacoustic delay lines, pulse expansion and pulse compression filters and so forth. Also, it will be appreciated that any one or more of elements 41 - 48 in feedforward filter 4 may include an analog-to-digital (A/D) or digital-to-analog (D/A) converters for converting signals.

In one example of a feedforward filter 4, consider filters 42, 44, 45, 46, 47 in the form of acoustic wave (SAW) devices with signal divider 41 and mixers 43, 48 all mounted in a flat printed circuit or microstrip type board or piezoelectric device as normally used by the prior art for implementing single filter 42 as a SAW. In another example of a feedforward filter 4, consider filter 42 in the form of the digital matched filter and correlator described in my U.S. Pat. No. 3,950,635. It is desired to reduce the error ΔG normally associated with the transfer function G of this type filter. For this case $G = X^*$, i.e., the transfer function of filter 42 is the complex conjugate $X^*$ of the Fourier transform X of signal x. The net gain and net error of the correlator are found using equations (4) and (5). As suggested previously, setting the bracket term in equation (4) equal to unity and setting F(z)G(z) = 1 results in the net system gain $H = X^*$ and net system error ΔH = 0. This may be accomplished by specifying mixer 48 as a digital adder for which the bracket term in equation (4) reduces to $2m - n = 1$ which in view of the fact that $m + n = 1$ specifies $m = \frac{2}{3}$ and $n = \frac{1}{3}$, i.e., specifies signal divider 41 as a digital divider for providing two-thirds of signal X to the correlator 42 and one-third of signal X to first delay means 45. Mixer 43 is specified as a digital differencer. Filter 44 has the transfer function $F = G^{-1} = (X^*)^{-1}$, i.e., is an inverse correlator (decorrelator) which means it computes the function mX having input the function $m \, |X|^2$ output from filter 42. It can be implemented as a digital decorrelator. Delay means 45, 47 can be implemented as digital delay lines, for example using shift registers, RAMs (random access memories) and so forth. Error filter 46 is specified to be the identical correlator used in filter 42. Thus, stand-alone correlator 42 has a transfer function G(z) and error ΔG(z) while feedforward correlator 4 in the system of the invention has the net gain G(z) with error ΔG(z) reduced to zero. Clearly again, the task of reducing the net error ΔG to zero while maintaining the net transfer function G of a correlator 42 is not possible in the prior art. In yet another example, consider a radar, sonar or communications system wherein the transmitter and receiver are connected by a space or transmission line link. By implementing the transmitter and receiver as feedforward transmitting and receiving filters, the errors normally associated with transmitters and receivers can be significantly reduced. Moreover by characterizing the transfer function G for the space link or transmission line, for example as a multipath, dispersive or clutter environment, the corresponding transfer functions F, K, $D_1$, $D_2$ can be specified to remove the spacelink associated error at the receiver. Similar applications can be foreseen wherein filter 42 is a test device, for example a microscope, astronomical telescope, or simple test detection device. Here it is desired to measure the presence or causality of signal X knowing that the test device (filter) 42 is not the source of the error.

It will also be appreciated that filters 31, 33 of FIG. 3 and 42, 44, 45, 46, 47 of FIG. 4 may themselves to feedforward filters 31, 33. Moreover, filters 42, 44, 45, 46, 47 may be implemented using all hardware or in a computer using software as is well known in the prior art, for example as demonstrated in the references by Rabiner and Rader (see part 2), in the reference by Gold and Rader, and in Rabiner and Gold (see Chapter 6).

From the foregoing it can be seen that the present invention implements a filter as a feedforwrd filter and in so doing decreases the error which is normally present in the filter. The invention therefore offers added benefits of signal filtering over the prior art.

In many applications it is desirable to reduce the errors in a filter. Such applications may require operations which include matched clutter filtering for echo ranging, or for coherent communications systems, convolution to obtain high resolution between signals and recursive filtering for general transformations on data vectors. The feedforward filter of the invention performs the signal filtering task in excess of the capabilities of prior art filters. Its applications include and are well suited for the detection, resolution and identification of signals and the determination of signal causality. Options for the implementation of filters are limited by the errors normally associated with a filter. The present invention offers outstanding practical implementations of error control in filters and should find use in such sophisticated signal processing tasks as system identification, signal identification, bit synchronization, bit detection, error correction, coding, pulse compression, geological and earthquake signal analysis, medical signal analysis and, in such diverse systems as radar, sonar, communications systems, electronic and medical test equipment and so forth. In particular, the present invention provides fast, accurate, efficient, and economic means for removing the errors in filters and thereby extending the speed, efficiency, and economic availability of such devices. As a consequence, the system of the present invention is expected to make dramatic increases in the accuracy and speed of operation of such devices and corresponding reductions in the cost and complexity of accurately detecting and identifying signals, i.e., in the speedup of operation, increasing of the accuracy, and lowering of the weight, size, power consumption and costs of radars, sonars, communications systems, test equipment and so forth.

Although a feedforwward filter has been described it should be understood that the scope of the invention should not be considered to be limited by the particular embodiment of the invention shown by way of illustration but rather by the appendant claims.

I claim:

1. A feedforward filter having a transfer function $H(z)$ comprising:
   a signal divider having input signal $X(z)$ and providing at its output signals $MX(z)$ and $nX(z)$, where $m + n = 1$;
   a first filter having an arbitrary transfer function $G(z)$,
   said output $mX(z)$ from said signal divider being input to said first filter,
   said first filter providing at its output the signal $G(z)mX(z)$;
   first delay means having transfer function $D_1(z)$,
   said output $nX(z)$ from said signal divider being input to said first delay means,
   said first delay means providing at its output the signal $D_1(z)nX(z)$;
   a second filter having transfer fucntion $F(z)$,
   said output $G(z)mX(z)$ from said first filter being input to said second filter,
   said second filter providing at its output the signal $F(z)G(z)mX(z)$;
   a first mixer having input the signals $F(z)G(z)mX(z)$ from said second filter and $D_1(z)nX(z)$ from said first delay means and providing at its output one of the error signal $\epsilon = F(z)G(z)mX(z) \pm D_1(z)nX(z)$;
   a third filter having transfer function $K(z)$,
   said output $\epsilon$ from said first mixer being input to said third filter,
   said third filter providing at its output the signal $K(z)\epsilon$;
   second delay means having transfer function $D_2(z)$,
   said output $G(z)mX(z)$ from said first filter being input to said second delay means,
   said second delay means providing at its output the signal $D_2(z)G(z)mX(z)$; and
   a second mixer having input the signals $D_2(z)G(z)mX(z)$ from said second delay means and $K(z)\epsilon$ from said third filter and providing at its output the signal $Y(z) = H(z)X(z)$,
   said output signal $Y(z)$ representing the convolution of said input signal $X(z)$ and said transfer function $H(z)$.

2. The system of claim 1 wherein said transfer function $H(z)$ is characterized by $H(z) = G(z)$.

3. The system of claim 1 wherein said transfer functions $G(z)$ and $F(z)$ are characterized by $F(z)G(z) = 1$.

4. The system of claim 1 wherein said transfer funtions $G(z)$ and $K(z)$ are characterized by $G(z) = K(z)$.

5. The system of claim 1 wherein said transfer functions $D_1(z)$ and $D_2(z)$ are characterized by $D_1(z) = D_2(z)$.

6. The system of claim 1 wherein one or more of said first, second, third filters and said first, second delay means are themselves feedforward filters.

7. The system of claim 1 wherein said first filter is matched filter.

8. The system of claim 1 wherein any one or more of said signal divider, said first, second, third filters, said first, second delay means, and said first, second mixers are implemented using special purpose hardware.

9. The system of claim 1 wherein at least one of said first and second mixers is a differencer.

10. The system of claim 1 wherein at least one of said signal divider, said first, second, third filters, said first, second delay means, and said first, second mixers is an analog device.

11. The system of claim 1 wherein at least one of said signal divider, said first, second, third filters, said first, second delay means, and said first, second mixers is a digital device.

12. A method for producing a feedforward filter having a transfer functon $H(z)$ including the steps of:
   inputting signal $X(z)$ into a signal divider;
   providing signals $MX(z)$ and $nX(z)$ at the output of said signal divider, wherein $m + n = 1$;
   inputting signal $mX(z)$ from said signal divider into a first filter having an arbitrary transfer function $G(z)$;
   providing signal $G(z)mX(z)$ at the output of said first filter;
   inputting signal $nX(z)$ from said signal divider into a first delay means having transfer function $D_1(z)$;
   providing signal $D_1(z)nX(z)$ at the output of said first delay means;

inputting signal G(z)mX(z) from said first filter into a second filter having transfer function F(z);

providing signal F(z)G(z)mX(z) at the output of said second filter;

inputting signals F(z)G(z)mX(z) from said second filter and $D_1(z)nX(z)$ from said first delay means into a first mixer;

providing one of the error signals $\epsilon = F(z)G(z)mX(z) \pm D_1(z)nX(z)$ at the output of said first mixer;

inputting signal $\epsilon$ from said first mixer into a third filter having transfer function K(z);

providing signal K(z)$\epsilon$ at the output of said third filter;

inputting signal G(z)mX(z) from said first filter into a second delay means having transfer function $D_2(z)$;

providing signal $D_2(z)$G(z)mX(z) at the output of said second delay means;

inputting signals $D_2(z)$G(z)mX(z) from said second delay means and K(z) $\epsilon$ from said third filter into a second mixer; and providing the signal Y(z) = H(z)x(z) at the output of said second mixer, said output signal Y(z) representing the convolution of said input signal X(z) and said transfer function H(z).

13. The method of claim 12 including the step of providing H(z) = G(z).

14. The method of claim 12 including the step of providing said first filter as a feedforward filter.

15. The method of claim 12 including the step of using said mixers in the form of a differencer.

* * * * *